United States Patent [19]

Schilling

[11] Patent Number: 4,915,743
[45] Date of Patent: Apr. 10, 1990

[54] SPACE SOLAR CELL

[75] Inventor: Roland Schilling, Gemmingen, Fed. Rep. of Germany

[73] Assignee: Telefunken Electronic GmbH, Heilbronn, Fed. Rep. of Germany

[21] Appl. No.: 250,447

[22] Filed: Sep. 28, 1988

[30] Foreign Application Priority Data

Oct. 5, 1987 [DE] Fed. Rep. of Germany ....... 3733645

[51] Int. Cl.$^4$ ...................... H01L 31/06; H01L 25/02
[52] U.S. Cl. .................................... 136/256; 136/244; 136/292
[58] Field of Search ........................ 136/244, 256, 292

[56] References Cited

U.S. PATENT DOCUMENTS

| 4,433,201 | 2/1984 | Fellas ........................... 136/251 |
| 4,601,526 | 7/1986 | White et al. ................ 339/17 CF |

FOREIGN PATENT DOCUMENTS

| 2541536 | 3/1977 | Fed. Rep. of Germany ...... 136/245 |
| 2919041 | 11/1980 | Fed. Rep. of Germany ...... 136/256 |
| 3011660 | 1/1981 | Fed. Rep. of Germany ........ 357/65 |
| 3511082 | 2/1985 | Fed. Rep. of Germany ...... 136/244 |
| 3617675 | 12/1986 | Fed. Rep. of Germany ...... 136/244 |
| 3606464 | 3/1987 | Fed. Rep. of Germany ...... 136/256 |
| 3619311 | 11/1987 | Fed. Rep. of Germany ...... 136/244 |
| 61-202475 | 9/1986 | Japan ................................... 136/245 |
| 62-229985 | 10/1987 | Japan ................................... 136/256 |

OTHER PUBLICATIONS

E. Suppa et al, *Raumfahrtforschung*, Heft 5/69, pp. 205-212.

Dieter K. Schroder et al, "Solar Cell Contact Resistance-A Review", IEEE Transactions on Electron Devices, vol. ED-31, No. 5, May 1984, pp. 637-647.

Primary Examiner—Aaron Weisstuch
Attorney, Agent, or Firm—Spencer & Frank

[57] ABSTRACT

A space solar cell comprising a doped semiconductor basic element and metallic contacts on the front and rear, and a cover glass with contacts. To draw off the electrostatic charge generated on the surface of the cover glass of the solar cell, either a part of a connector contact homogeneously integrated with the contacts and projecting from the semiconductor element extends in a shapeable manner onto the cover glass of the solar cell, or a connector contact homogeneously integrated with the contact of the cover glass and projecting from the cover glass is connected to an electric contact of the solar cell.

20 Claims, 4 Drawing Sheets

4,915,743

SPACE SOLAR CELL

BACKGROUND OF THE INVENTION

The invention relates to a solar cell with a cover glass on a doped semiconductor basic element having a surface for light incidence and metallic contacts on that surface and on the opposite rear face of the semiconductor basic element, and having metallic contacts on the surface of the cover glass.

Solar cells used in space missions are covered with glasses, for example, quartz glass, to protect them from corpuscular radiation and micro-meteorites. If, however, such solar cells are used for supplying power to satellites with scientific measurement tasks, e. g., measurement of electrical and magnetic fields, electrical charges on the satellite surface and in particular on the solar cell cover glasses can have a disturbing effect on the measurements.

From the publication "Raumfahrtforschung" (space research), issue 5/69, section 4.3, page 211, it is known how to eliminate such electrostatic charges by providing the cover glasses with a metallic grid matching as closely as possible the cell surface in order to avoid additional light absorption.

The electrical connection method of the solar cells must then also incorporate these cover glass contacts, which must be electrically earthed or grounded.

SUMMARY OF THE INVENTION

The object of the invention is to provide a simple and inexpensive connection method with which the surfaces of the cover glasses of solar cells for space missions can be provided with contacts.

According to the invention, there are provided contacts on the semiconductor element and cover glass which have connector contacts integrated homogeneously with the contacts and at least partially projecting beyond the respective carrier elements in such a way that via these connector contacts the cover glass is connectable to a contact of the semiconductor element, and the contacts of the semiconductor element are connectable to further solar cells.

In an advantageous embodiment of the invention, the integrated connector contact of the semiconductor element comprises two parts, so that one part can be connected to the contact of the cover glass.

A preferred embodiment of the invention is achieved by connecting the integrated connector contact of the cover glass to a contact of the semiconductor element.

Further advantageous embodiments of the invention are the subject of the appended claims.

BRIEF DESCRIPTION OF THE DRAWINGS

In the following, embodiments of the invention are described in detail using the wherein.

DESCRIPTION OF THE PREFERRED EMBODIMENTS

Figure 1:
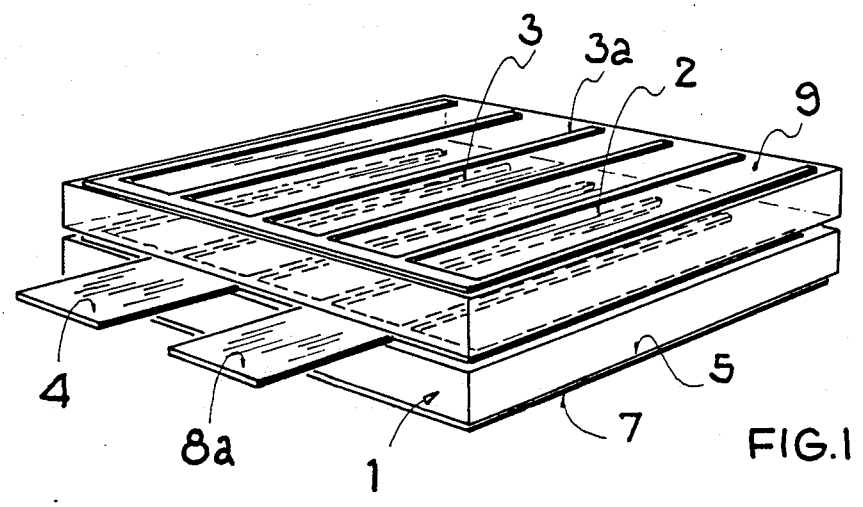
FIGS. 1 and 2 are space solar cells drawn in perspective, having integrated connector contacts disposed on the semiconductor element in accordance with one embodiment of the invention to provide contacts for the cover glasses.

FIG. 1 shows the first embodiment of the invention. This is a solar cell having a doped semiconductor basic element 1, for example of monocrystalline silicon, in which a pn-junction has been formed. Its surface 2 intended for light incidence is covered by a metallic contact 3 having a comb-like structure. A cover glass 9 is provided on this surface that protects the surface 2 of the solar cell from corpuscular radiation and micro-meteorites. The surface of the cover glass is also provided with a metallic, comb-like contact 3a which is congruent to the cell surface. The comb-like metallic contact 3 changes at a web, arranged on the edge of the surface 2 parallel to an edge of the semiconductor basic element 1, into two rectangular surfaces 4 and 8a which project beyond the semiconductor basic element 1 and are thereby shapeable, said surfaces being thereby homogeneously integrated with the contact 3 as a connector contact. On the rear side or surface 5 of the semiconductor basic element 1 a further metallic contact 7 is provided that covers the entire rear side 5.

The metallic contacts 3, 3a and 7 and the connector contacts 4 and 8a preferably comprise a titanium/palladium/silver layer system having a layer thickness between 4 and 13 μm.

Figure 2:
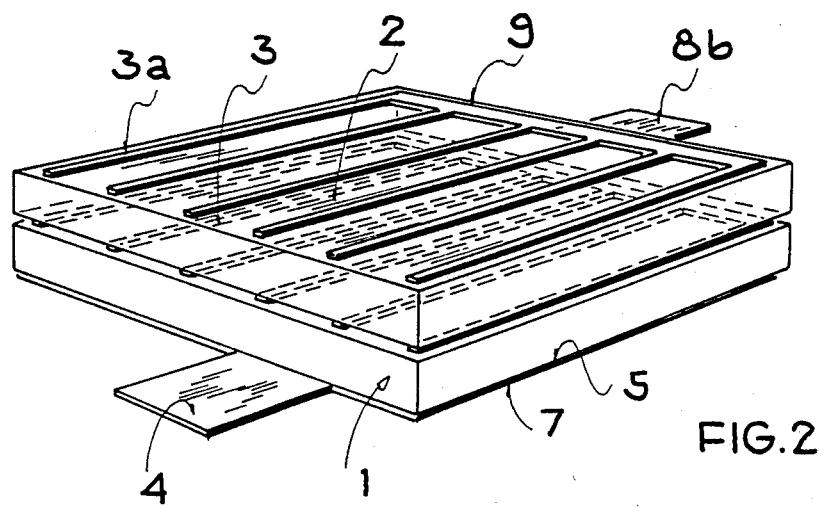

A second embodiment of the invention is represented by the solar cell according to FIG. 2, which corresponds to a modification of the cell according to FIG. 1. Unlike the solar cell according to FIG. 1, the cell here has metallic contacts 3 and 7 arranged both on the front surface 2 and on the rear surface 5, said contacts changing at opposing edges of the semiconductor basic element 1, at one edge each, into rectangular, projecting, and therefore shapeable connector contacts 4 and 8b, respectively. The information given for FIG. 1 applies for thickness dimensions and material compositions.

Figure 3:
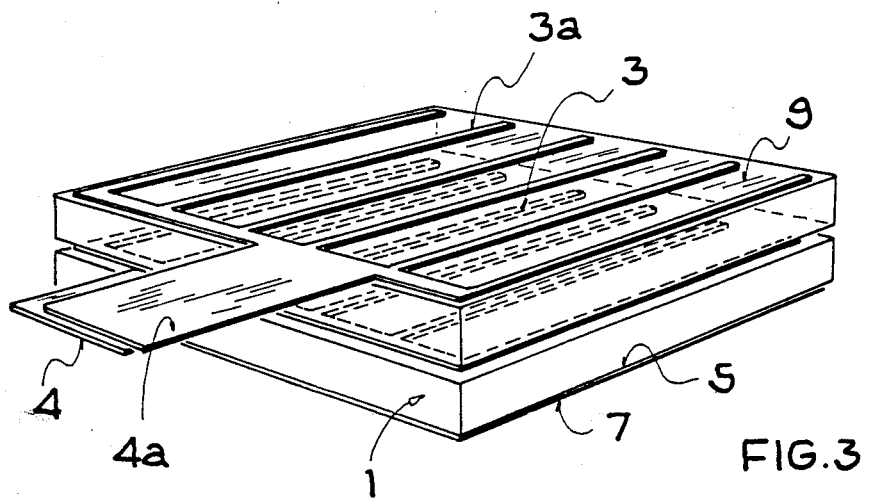
FIGS. 3 and 4 are space solar cells drawn in perspective, having integrated connector contacts in accordance with another embodiment of the invention, on the cover glasses.
Figure 4:
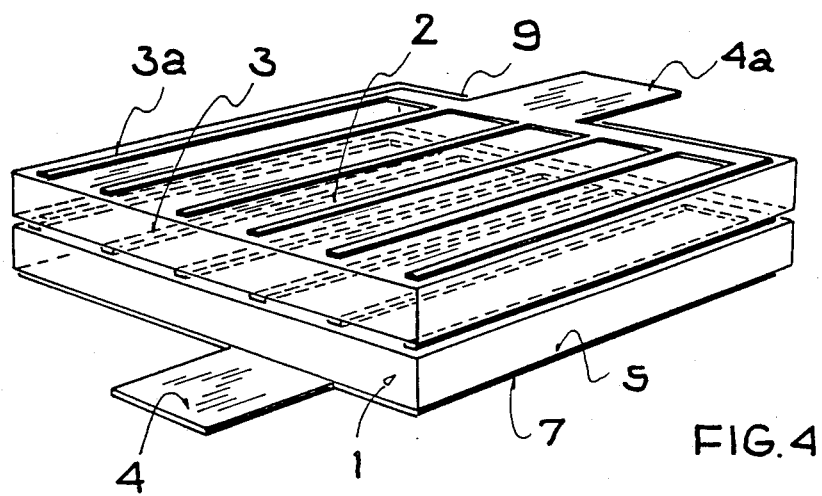

In a further embodiment of the invention according to FIG. 3, the contact 3a arranged on the surface of the cover glass 9 also changes at its web, which is arranged on the edge of the cover glass 9 parallel to an edge of the semiconductor basic element 1, into a rectangular surface 4a, which projects beyond the cover glass 9 and is thereby shapeable, said surface thereby being homogeneously integrated with the connecting contact 3a as a connector contact. The semiconductor element 1 protected by the cover glass 9 has in the same way an integrated connector contact 4 connected to the contact 3 of the semiconductor element 1, said connector contact being aligned parallel to the integrated connector contact 4a of the cover glass 9, projecting, like the latter contact but shorter, beyond the edge, and being arranged on the same side and offset in relation to the connector contact 4a. The embodiment of the invention according to FIG. 4 shows an advantageous modification of the cell according to FIG. 3, where the contact 3a arranged on the surface of cover glass 9 like the solar cell in FIG. 3 also changes into a rectangular connector contact 4a projecting beyond the edge and thereby shapeable, whereas the second integrated connector contact 4 is not connected homogeneously to the contact 3, but to the contact 7 covering the rear of the semiconductor element 1, with the two connector contacts 4a and 4a being arranged on opposite sides of the solar cell and offset in relation to one another.

Figure 5:
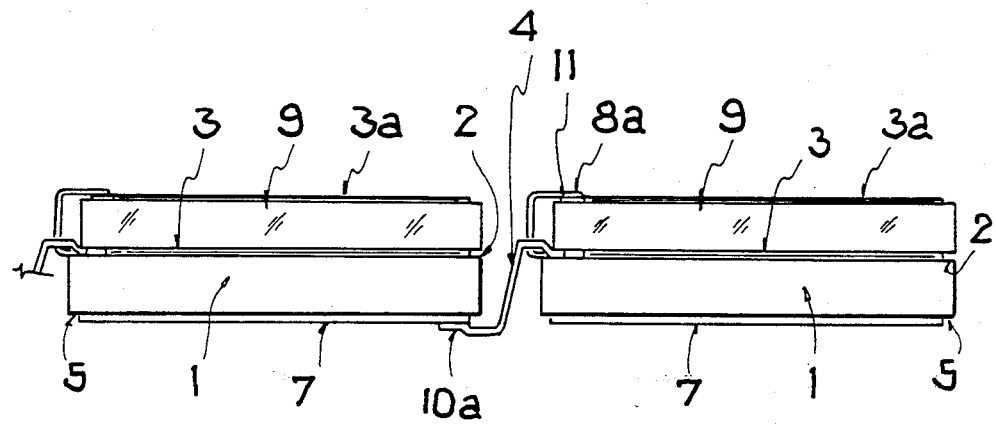
FIGS. 5, 6, 7 and 8 are each a sectional drawing of connected space solar cells having contacts on the cover glasses in accordance with the invention.

FIG. 5 shows a general wiring method for solar cells designed according to FIG. 1. The connector contact 4 here on the surface of a solar cell for series connection to the metallic contact 7 of a further solar cell is fastened in an electrically conducting manner to a contact connection point 10a provided for the purpose, while the connector contact 8a is fastened in an electrically conducting manner via the contact connection point 11 to the contact 3a arranged on the surface of the cover glass 9. The cross-sectional forms of the shapeable connector contacts 4 and 8a are pre-stamped in S-shape and U-shape respectively in order to counter thermically caused elongations of the solar module.

Figure 6:
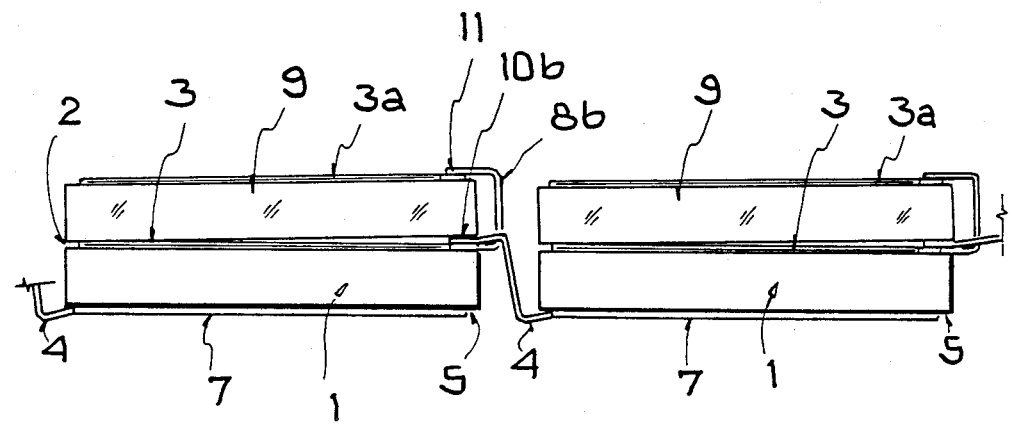

FIG. 6 shows a general series connection method for solar cells designed in accordance with FIG. 2. The connector contact 4 on the rear of a first solar cell is fastened in an electrically conducting manner to a contact connection point 10b on the metallic contact 3 of a second solar cell, whereas the contact 8b of the second solar cell is connected in an electrically conducting manner via a contact connection point 11 to the contact 3a located on the surface of the cover glass 9. The cross-sectional forms of the connector contacts 4 and 8b are also pre-stamped in S-shape and U-shape respectively.

Figure 7:
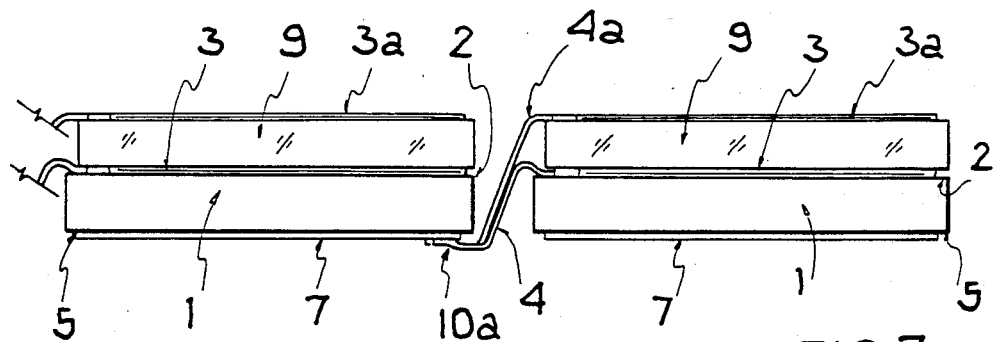

A further connection method is shown in FIG. 7, whereby solar cells in accordance with FIG. 3 are series-connected using the connector contacts 4 and 4a in accordance with the invention. Here, the connector contacts 4 and 4a of a first solar cell are fastened in an electrically conducting manner to the metallic contact 7 of a second solar cell at a contact connection point 10a provided for the purpose.

Figure 8:
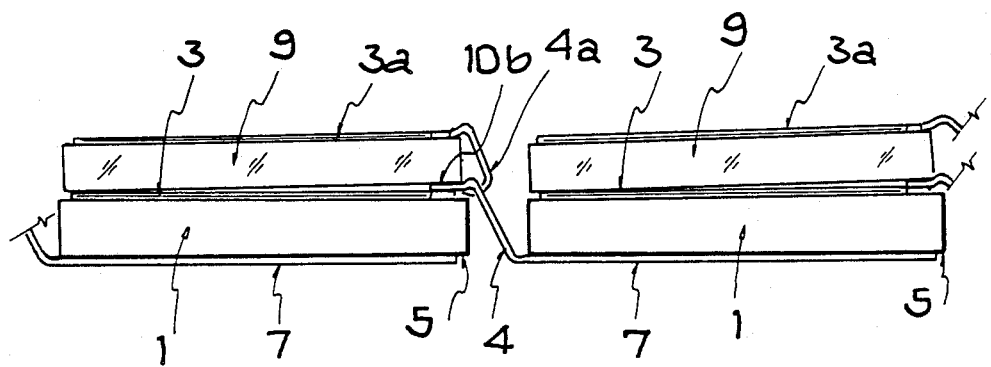

Solar cells designed in accordance with FIG. 4 are connected in similar fashion, as shown in FIG. 8. Here too both the connector contact 4 of the semiconductor element 1 of a first solar cell and the connector contact 4a of the cover glass 9 of a second solar cell lead to the contact connection point 10b of the second solar cell in order to achieve an electrically conducting connection to the contact 3.

The cross-sectional forms of the connector contacts 4 and 4a are also pre-stamped in S-shape and U-shape respectively in the connection methods according to FIGS. 7 and 8.

The two last-described embodiments have the advantage from the production aspect of not requiring additional contact connection points to ensure contact of the cover glasses as shown in FIGS. 5 and 6, where a further contact connection point 11 or 10b is required respectively.

To fasten the connector contacts 4, 4a, 8a and 8b to the respective contacts, soldering, welding, glueing or ultrasonic welding methods are suitable.

With these connecting contacts 4a, 8a and 8b in accordance with the invention, simple, inexpensive and reliable contacts for the cover glasses of space solar cells are provided.

This contact method in accordance with the invention for the cover glasses of space solar cells can also be used advantageously for those cover glasses coated with electrically conducting yet transparent material, for example titanium oxide.

What is claimed is:

1. In a solar cell including a doped semiconductor basic element having a first surface for light incidence and metallic contacts on the first surface and on the opposite rear surface of the semiconductor basic element, and a cover glass disposed on said first surface and having metallic contacts on the outer surface of the cover glass; the improvement wherein the contacts on the semiconductor element and the cover glass have connector contacts integrated homogeneously with the contacts and at least partially projecting beyond the respective carrier elements such that via these connector contacts the cover glass is electrically connectable to a contact of the semiconductor element, and the contacts of the semiconductor element are connectable to further solar cells.

2. A solar cell with cover glass according to claim 1, wherein a projecting portion of the integrated connector contact of the semiconductor element is connected to the contact of the cover glass.

3. A solar cell with cover glass according to claim 1, wherein the integrated connector contact of the cover glass is connected to a contact of the semiconductor element.

4. A solar cell with cover glass according to claim 1, wherein the metallic contacts and the integrated connector contacts comprise the same material composition.

5. A solar cell with cover glass according to claim 1, wherein the metallic contacts and the integrated connector contacts comprise a titanium/palladium/silver layer sequence.

6. A solar cell with cover glass according to claim 1, wherein the integrated connector contacts are shapeable.

7. A solar cell with cover glass according to claim 1 including two of said at least partially projecting connector contacts which are integrated with said contacts.

8. A solar cell with cover glass according to claim 7 wherein said two projecting connector contacts are both integrated with said metallic contact on said first surface.

9. A solar cell with cover glass according to claim 8 wherein said solar cell is rectangular and said two projecting connector contacts project from the same side of said solar cell.

10. A solar cell with cover glass according to claim 9 wherein one of said two projecting connector contacts is connected to the contact on said outer surface of said cover glass.

11. A solar cell with cover glass according to claim 7 wherein said solar cell is rectangular; one of said two projecting connector contacts is integrated with said contact on said first surface and the other of said two projecting connector contacts is integrated with said contact on said outer surface of said cover glass; and said two projecting connector contacts project from the same side of said solar cell in a partially overlapping relationship.

12. A solar cell with cover glass according to claim 7 wherein said solar cell is rectangular and said two projecting connector contacts project from opposite sides of said solar cell.

13. A solar cell with cover glass according to claim 12 wherein one of said two projecting connector contacts is integrated with said contact on said rear surface of said semiconductor basic element and the other of said two projecting connector contacts is integrated with said contact on said first surface of said semiconductor basic element.

14. A solar cell with cover glass according to claim 12 wherein one of said two projecting connector contacts is integrated with said contact on said rear surface of said semiconductor basic element and the other of said two projecting connector contacts is integrated with said contact on said outer surface of said cover glass.

15. In a solar cell including a doped semiconductor basic element having a first surface for light incidence, a comb-like first metallic contact disposed on said first surface, a second metallic contact disposed on the rear surface of said semiconductor basic element, a cover glass disposed on said first surface, and a comb-like third metallic contact disposed on the outer surface of said cover glass; the improvement wherein: one of said first and second contacts is provided with a first connector which is homogeneously integrated with and forms an extension of the respective said first and second contact and which at least partially projects laterally beyond the edge of said semiconductor element; one of said first and third contact is provided with a second connector which is homogeneously integrated with an forms an extension of the respective said first and third contacts and which at least partially projects laterally beyond the edge of the respective carrier element for the first and third contacts, and said second connector is shaped and electrically connected to the other of said first and said third contacts to connect said outer surface of said cover glass to said first contact.

16. A solar cell according to claim 15 wherein said first and second connectors are both integrated with said first contact.

17. A solar cell according to claim 16 wherein said first and second connectors project beyond said edge of said semiconductor element adjacent one another.

18. A solar cell according to claim 15 wherein said first and second connectors are integrated with said first and third contacts, respectively.

19. A solar cell according to claim 18 wherein said first and second connectors project beyond said edge of said semiconductor element in a partially overlapping arrangement.

20. A solar cell according to claim 15 wherein said first and second connectors are integrated with said second and third contacts, respectively.

* * * * *